United States Patent
Wei

(10) Patent No.: US 6,642,465 B2
(45) Date of Patent: Nov. 4, 2003

(54) SUSPENSION CORD SWITCH

(76) Inventor: Jung-Tsung Wei, No. 176, Section 2, Tong-Man Road, Tainan City (TW)

( * ) Notice: Subject to any disclaimer, the term of this patent is extended or adjusted under 35 U.S.C. 154(b) by 0 days.

(21) Appl. No.: 10/300,633

(22) Filed: Nov. 21, 2002

(65) Prior Publication Data

US 2003/0079978 A1 May 1, 2003

Related U.S. Application Data

(63) Continuation-in-part of application No. 09/984,111, filed on Oct. 29, 2001, now abandoned.

(51) Int. Cl.[7] .................................................. H01H 9/00
(52) U.S. Cl. ........................ 200/331; 315/362; 362/253
(58) Field of Search ........................ 315/362; 362/253; 200/543, 61.45 R, 61.48–61.91, 368, 318, 312, 313, 329, 330, 331, 334

(56) References Cited

U.S. PATENT DOCUMENTS

| | | | | | |
|---|---|---|---|---|---|
| 5,166,482 A | * | 11/1992 | Li | ............................. | 200/52 R |
| 5,208,516 A | * | 5/1993 | Saidian | ........................ | 315/362 |
| 5,396,037 A | * | 3/1995 | Moore et al. | ................ | 200/331 |
| 5,454,056 A | * | 9/1995 | Brothers | ....................... | 385/16 |
| 5,532,557 A | * | 7/1996 | Saidian | ........................ | 315/362 |
| 5,661,370 A | * | 8/1997 | Messick | ....................... | 315/158 |
| 6,295,871 B1 | * | 10/2001 | Wei | ............................. | 73/570 |
| 6,315,431 B1 | * | 11/2001 | Greedy | ........................ | 362/253 |

* cited by examiner

Primary Examiner—Michael Friedhofer
(74) Attorney, Agent, or Firm—Alan D. Kamrath; Rider Bennett, LLP.

(57) ABSTRACT

A suspension cord switch includes a capacitive induction device serving as a touch control with capacitive induction effect, wherein a capacitive sensor or device is connected to a suspension cord. The capacitive induction device includes a contact unit hanged in a hollow touch unit and connected to a grounded conductive wire so that when the hollow touch is petted, the contact unit contacts the touch unit to activate the electric appliance connected with the suspension cord.

2 Claims, 7 Drawing Sheets

SUSPENSION CORD SWITCH

This is a Continuation-In-Part application for applicant's former application having the application Ser. No. 09/984,111, filed Oct. 29, 2001 now abandoned with the title of "SUSPENSION CORD PULL SWITCH".

FIELD OF THE INVENTION

BACKGROUND OF THE INVENTION

Conventional suspension chain (string-pulling) switches have been widely used by people for the past 40 or 50 years, because they have some advantages. The object hanging high above has a low trouble rate, is convenient for operation, has a height of suspended string that can be adjusted freely to suit the position of the switch. The suspended switch can suit the needs of various circumstances. Another important reason for the popular use of the conventional suspended chain or pull string switch lies in that: the suspended string of switch hangs in midair, showing its conspicuous position for operation. Therefore, for a long period of time, people have become accustomed to it. Take the electrical household appliances as example, consumers would often have trouble located at different locations in different appliances. This problem is aggravated because of the wider and wider variety of switches available on the market.

The suspension pull switch has a unique among all type of switches. It is conspicuously located for people to see. For the past 40 to 50 years, consumers are familiar with their use and operation. But conventional types suspension switches have shortcomings that need improvement, including the four steps that must be followed (as shown in FIGS. 1 through 4):

1. The user's fingers must come in contact with the suspension cord 1.
2. The user must firmly grasp the suspension cord 1.
3. After grasping the suspension cord 1, the user must apply a sufficient force to pull the suspension down.
4. Finally, the user releases his fingers from the suspension cord 1.

Such operation requires sophisticated procedures, and is labor and time-consuming, inconvenient and requiring precision. Because, the user could not pull the cord down without correctly locating and grasping the suspension cord 1. Meanwhile, when performing step 3, the suspension cord 1 must be pulled down to effect switching control. If the suspension cord 1 is pulled in an oblique angle, the switch could not be performed correctly, or could not work. Or, the switch may be damaged, and its service life may be shortened. Therefore, conventional type of suspension switch involves the restriction on the direction of operation. (Pulling in a downward direction could not be free from directional restriction.) Secondly, the force applied in pulling the suspension cord 1 must be controlled correctly. In case of excessive pulling force, the switch could be damaged. On the other hand, an insufficient force will not be able to perform the switching function. In the process of grasping the suspension cord 1, if in the first try the user cannot grasp the suspension cord 1 successfully, the suspension cord 1 could jump or swing in every direction conceivable; therefore in many cases the user has to try several times before he can successfully grasp and pull the suspension cord 1 and activate the switch. To prevent the suspension cord 1 from slipping out of hand after the cord is grasped in hand, there is a stopper object 11 installed at the end of the suspension cord 1, to stop the suspension cord 1 from slipping out of hand. But the stopper object 11 do not have other functions except just that.

U.S. Pat. No. 6,315,431 B1 to Greedy discloses a pull type chain with a light which is activated by a light sensitive switch that turns on a light emitting diode when the amount of light in a room falls below a predetermined level. The main purpose of the disclosure is that the light with the chain makes the user to easily identify the position of the chain. In other words, the user still has to grasp and pull the chain to turn the electrical appliance.

U.S. Pat. No. 5,208,516 to Saidian discloses a touch controlled electric light socket. As disclosed in FIGS. 8 and 9, the user has to pet or touch the distal end of the cord, although an enlargement 111 is connected to the distal end 109.

The present invention provides a suspension cord switch that is simply petted to activate the electric appliance, even if the suspension cord is petted by an insulation object.

SUMMARY OF THE INVENTION

The present invention relates to a suspension cord switch which comprises a suspension cord which has a capacitive induction sensor connected to one end of a suspension cord and the suspension cord includes a conductive wire. The suspension cord is a touch or non-touch control with capacitive induction effect, without requiring a user to grasp the suspension cord, to aim at the specified direction, or to apply a specified minimum force.

The primary object of the present invention is to provide a suspension cord switch for activating an electric appliance which is activated simply by petting or touching the suspension cord.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
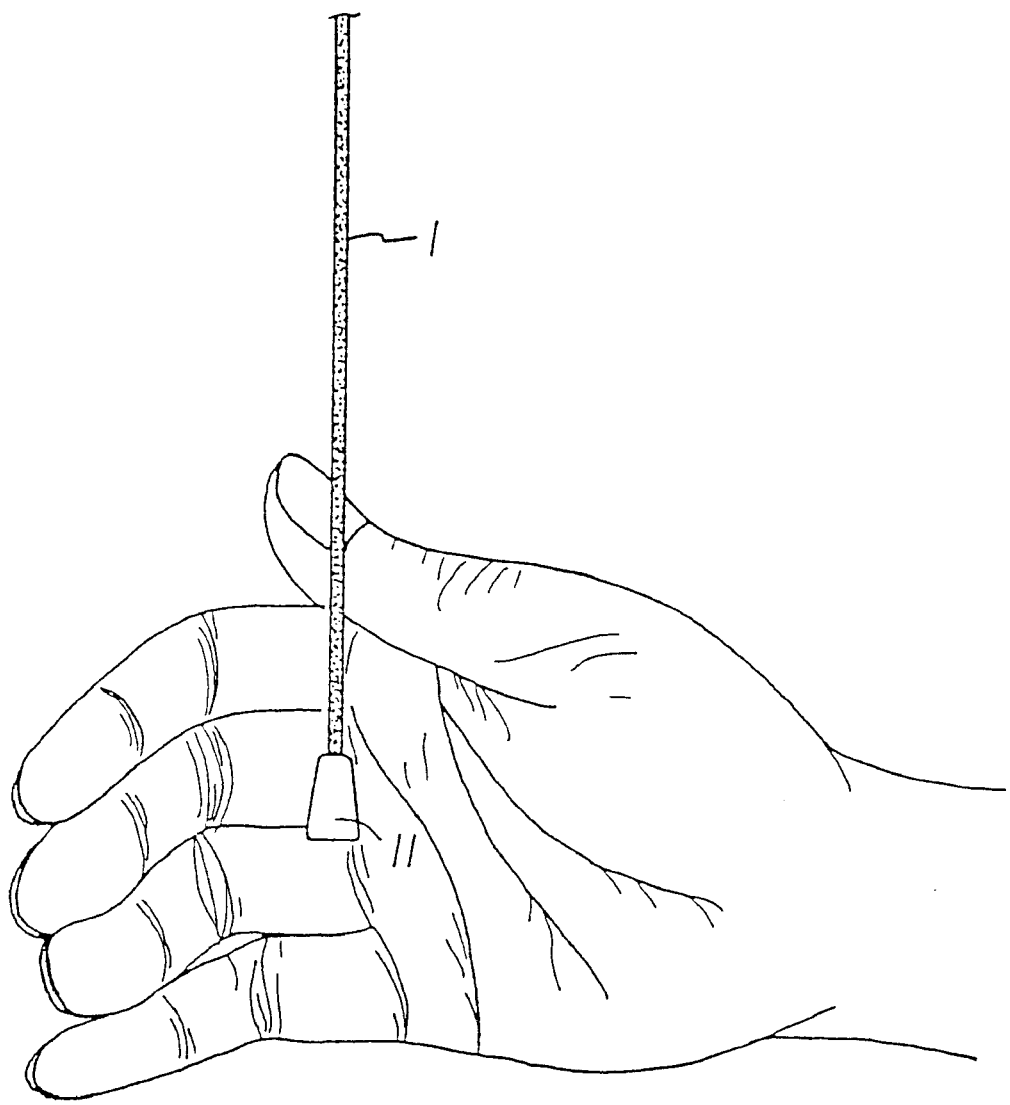
FIG. 1 shows the operation of a first conventional suspension cord pull switch.
Figure 2:
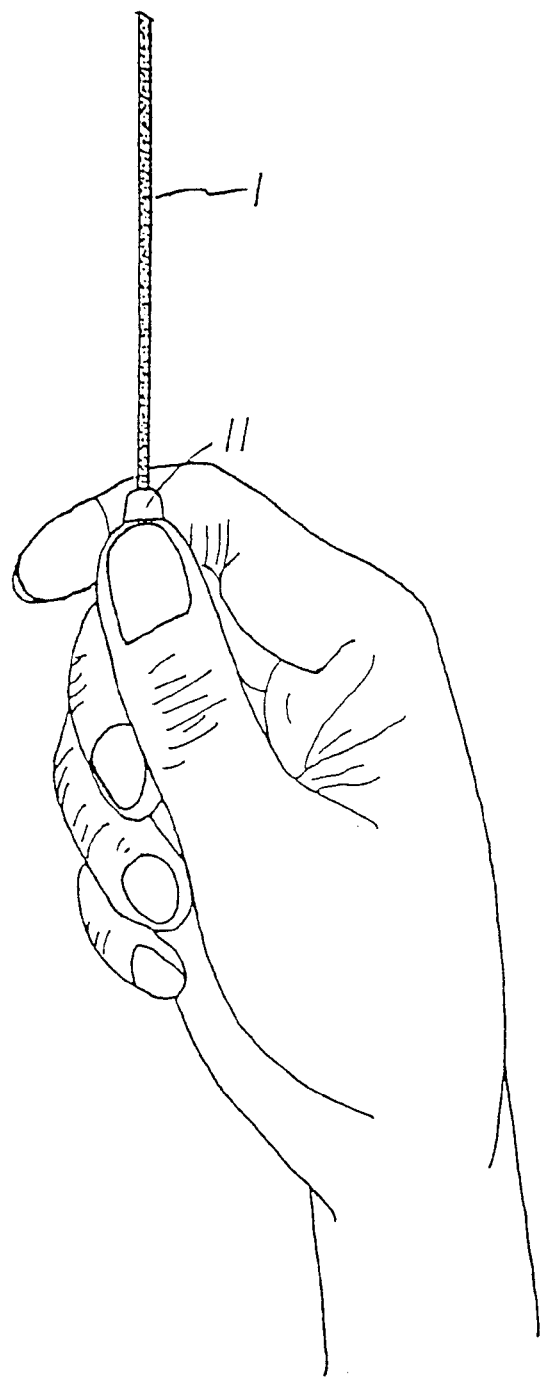
FIG. 2 shows the operation of a second conventional suspension cord pull switch.
Figure 3:
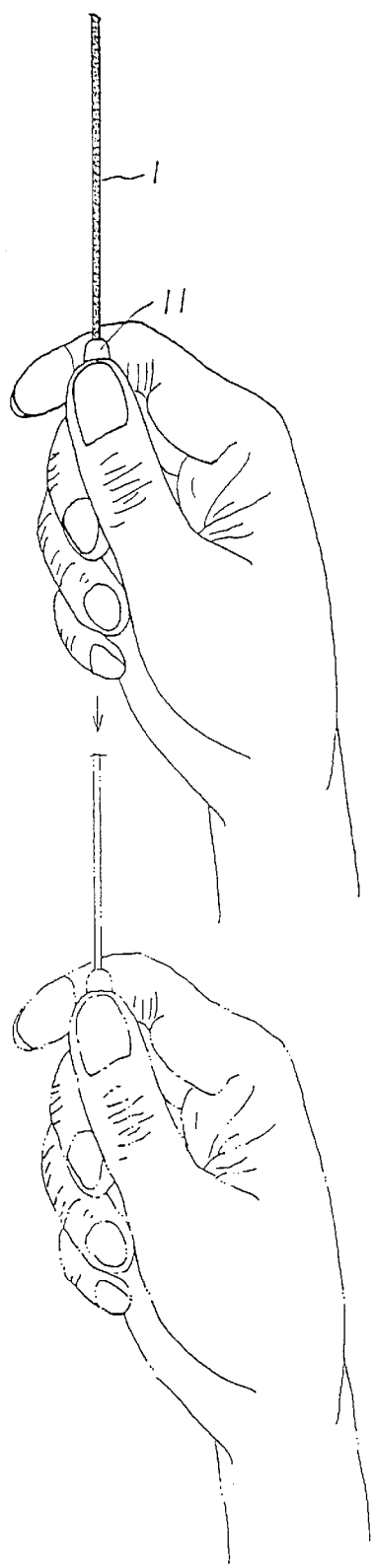
FIG. 3 shows the operation of a third conventional suspension cord pull switch.
Figure 4:
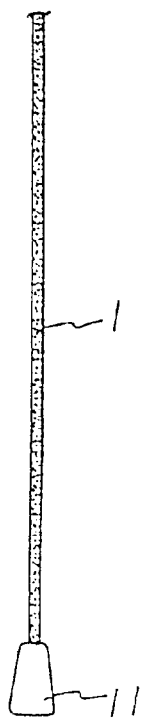
FIG. 4 shows the operation of a fourth conventional suspension cord pull switch.
Figure 4:
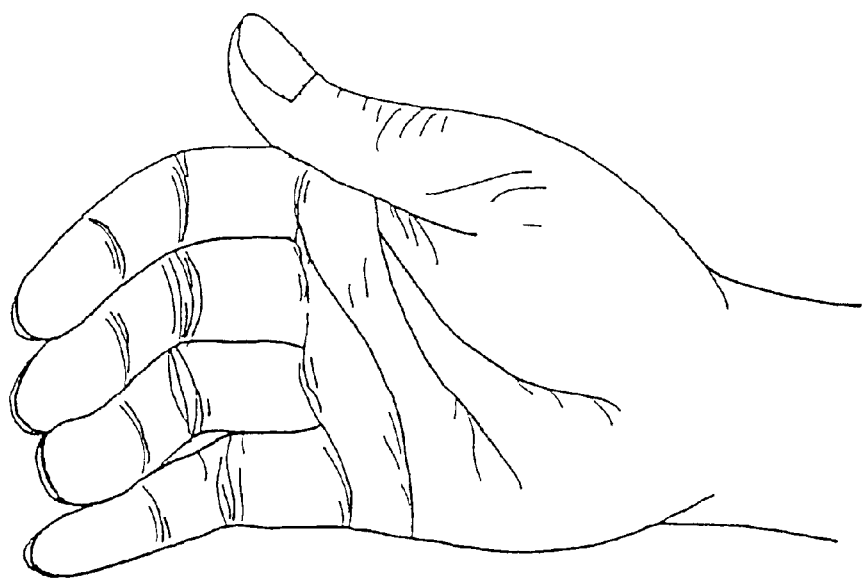
Figure 5:
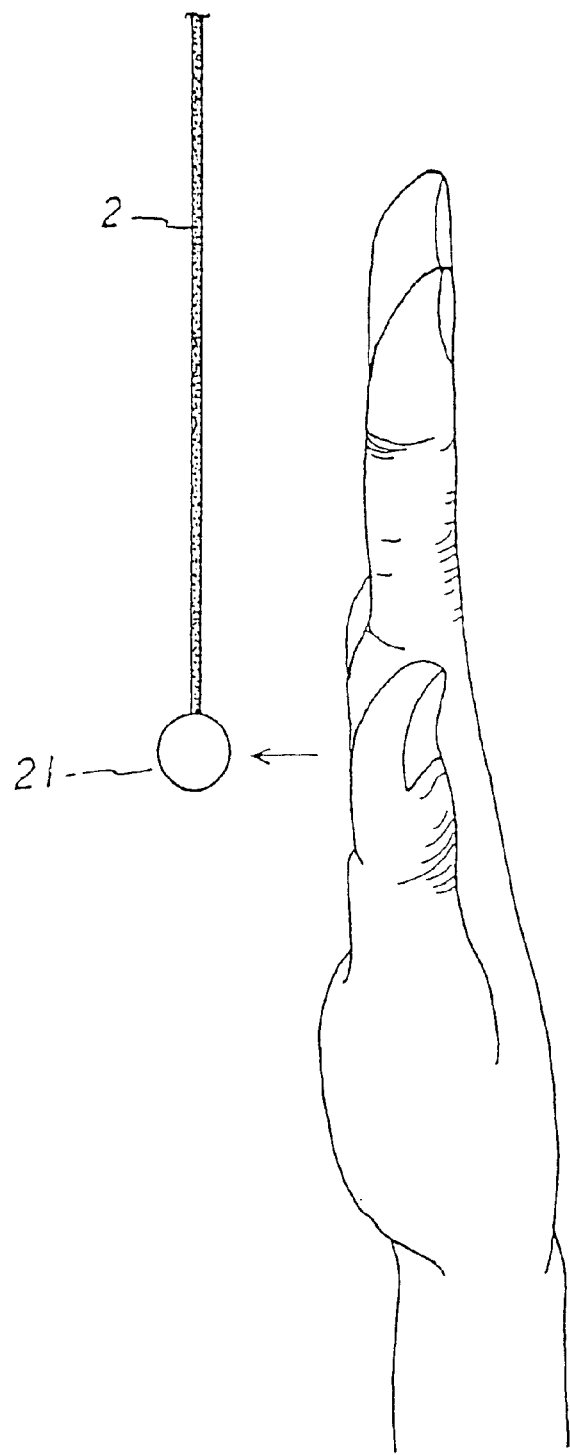
FIG. 5 is a perspective view of the suspension cord switch of the present invention and a hand is to pet the suspension cord switch.
Figure 7:
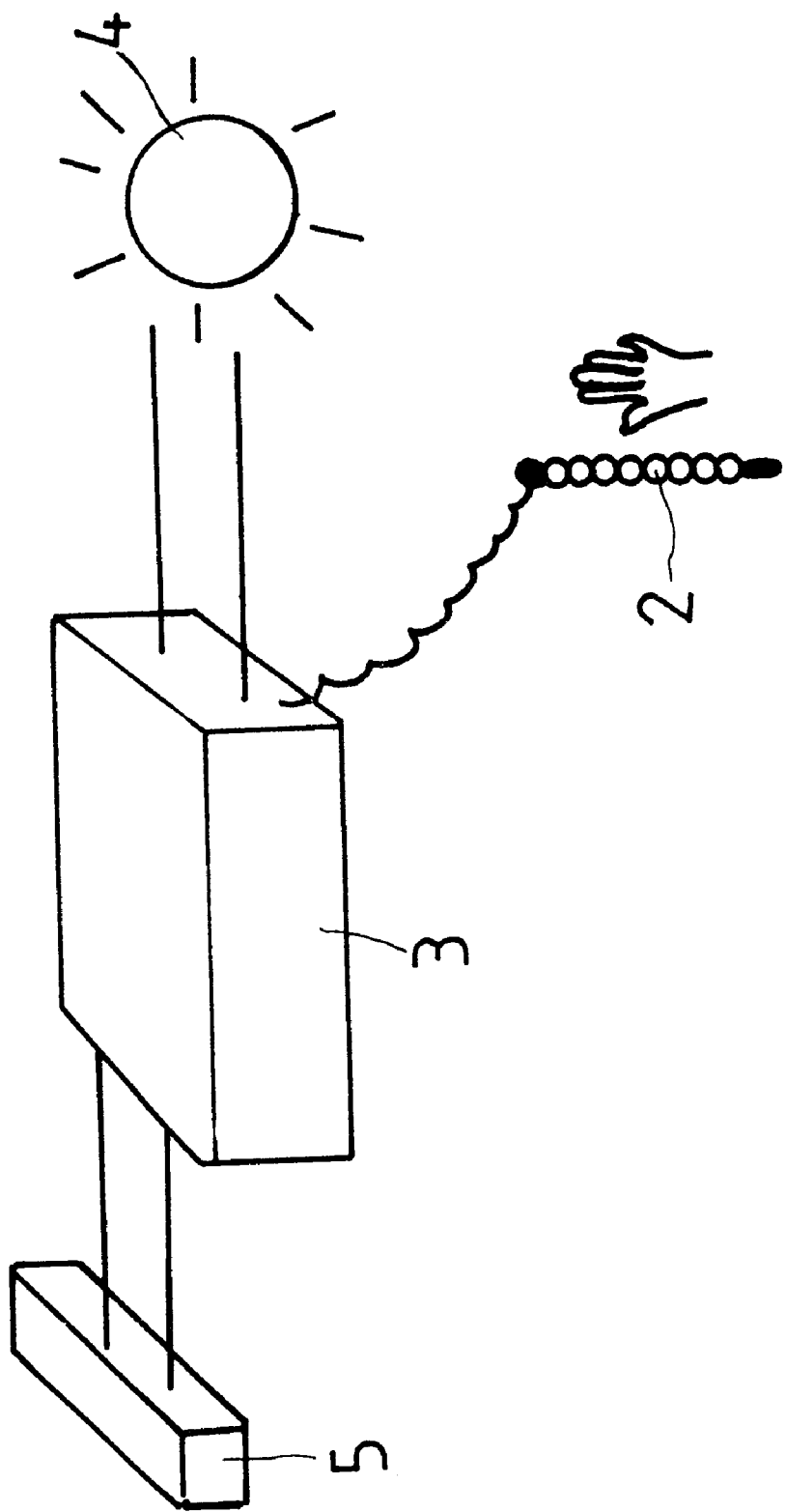
FIG. 7 shows the connection of the suspension cord switch of the present invention, the control box, and the electric appliance.

Referring to FIGS. 5 and 7, the suspension cord switch of the present invention comprises a capacitive device and a suspension cord 2. The suspension cord 2 is a flexible cord and one end of the suspension cord 2 is connected to the capacitive sensor or device such as a control box 3 in which a control circuit board (not shown) is received. Two wires extending from the control box 3 are connected to an electric appliance 4 such as a lamp and the other two wires extending from the control box 3 are connected to a power supply 5. The suspension cord 2 becomes a touch or non-touch control cord with a capacitive induction effect. The user can control the electric appliance by touching the suspension cord 2 instead of grasping onto the suspension cord 2. The suspension cord 2 can be touched or approached in any direction to perform the control, which is very easy and convenient. There is no minimum requirement on the force being applied when the suspension cord 2 is touched or pulled. Therefore, the witch will not be subjected to wear, tear or damaged after it is in use for a period of time.

Figure 6:
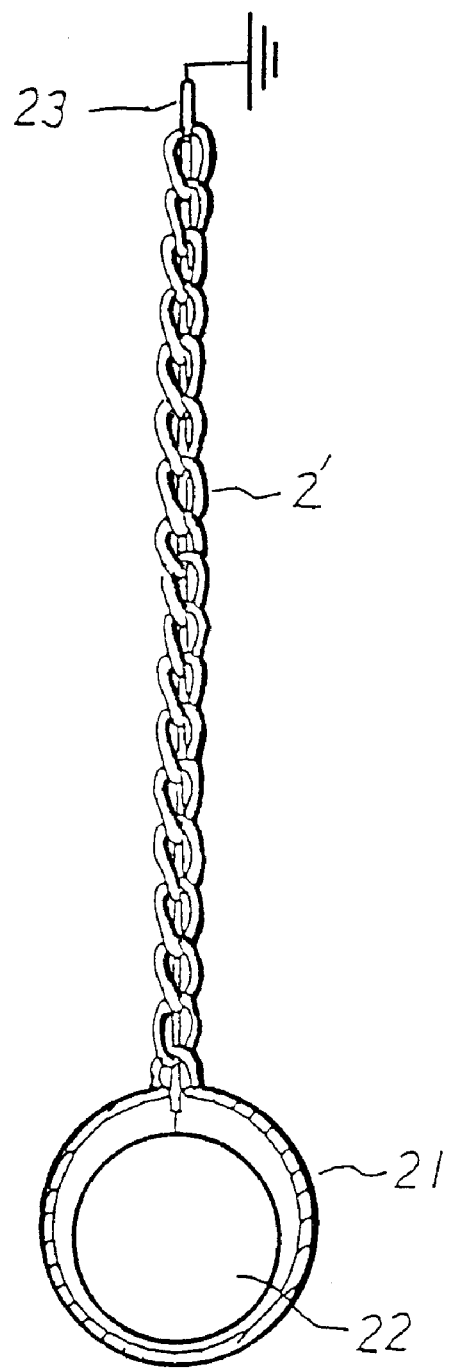
FIG. 6 shows another embodiment of the suspension cord switch of the present invention.

FIG. 6 shows another embodiment of the present invention wherein a suspension cord 2' having an end connected to a hollow touch unit 21 and the other end of the suspension cord 2' is connected to the control box 3. A contact unit 22 is freely hanged by a grounded conductive wire 23 and located in the contact unit 21 with a gap defined between the inside of the hollow touch unit 21 and the contact unit 22. The grounded conductive wire 23 is located within the suspension cord 2' and the contact unit 22 contacts the inside of the touch unit 21 when the contact unit 22 swings. The contact of the contact unit 22 and the touch unit 21 can be made by petting the suspension cord 2 or the touch unit 21. Even if the user tries to touch the suspension cord 2' by a gloved hand or a plastic ruler, the vibration may cause swinging of the suspension cord 2' or the grounded conductive wire 23, enabling contact between the contact unit 22 and the touch unit 21, producing the effect of touch control.

Moreover, the touch control performed on the suspension cord 2 or 2' can be varied by repetition of touches on the suspension cord 2 or 2'. A is often seen in the control of an electric ceiling fan, when the suspension cord 2 or 2' is touched for the first time, the fan is rotated at an optional first speed. When the suspension cord 2 or 2' is touched the second time, the fan is rotated at an optional second speed. Therefore, the multiple-step control of a conventional suspension cord switch can be performed.

Optionally, to enable the user to see the suspension cord 2 or 2' or the touch unit 21 in the nighttime, the suspension cord 2 or 2' or the touch unit 21 can be coated with a fluorescent compound or a light-emitting object, or a lamp can be fitted. Furthermore, to avoid damage to the suspension cord 2 or 2' as may be caused by frequent pulling, as is the practice employed on conventional pull switches, a buffer device can be connected to the suspension cord 2 or 2' so that when the suspension cord 2 or 2' is pulled, there will be no bad effect that may lead to damage.

While we have shown and described the embodiment in accordance with he present invention, it should be clear to those skilled in the art that further embodiments may be made without departing from the scope of the present invention.

What is claimed is:

1. A suspension cord switch comprising:

a suspension cord having a first end connected to a hollow touch unit and a second end connected to a control box, and a contact unit hung on a grounded conductive wire and located in the touch unit with a gap defined between an inside of the touch unit and the contact unit, the contact unit contacting the inside of the touch unit when the contact unit swings.

2. The switch as claimed in claim 1, wherein the grounded conductive wire is located within the suspension cord.

\* \* \* \* \*